（12）United States Patent
Kim et al.

(10) Patent No.: US 9,171,913 B2
(45) Date of Patent: Oct. 27, 2015

(54) THIN FILM TRANSISTOR AND METHOD OF MANUFACTURING THE SAME AND DISPLAY DEVICE INCLUDING THE SAME

(71) Applicants: Samsung Display Co., Ltd., Youngin, Gyeonggi-Do (KR); Industry Academy Cooperation Foundation of KyungHee University, Youngin-si, Gyeonggi-do (KR)

(72) Inventors: Tae-Woong Kim, Yongin (KR); Jin Jang, Seoul (KR); Christophe Vincent Avis, Seoul (KR); Youn-Goo Kim, Seoul (KR)

(73) Assignees: Samsung Display Co., Ltd., Samsung-ro, Giheung-Gu, Yongin-si, Gyeonggi-Do (KR); INDUSTRY ACADEMY COOPERATION FOUNDATION OF KYUNGHEE UNIVERSITY, Seocheon-Dong, Giheung-Gu, Yongin-Si, Gyeonggi-Do (KR)

( * ) Notice: Subject to any disclaimer, the term of this patent is extended or adjusted under 35 U.S.C. 154(b) by 0 days.

(21) Appl. No.: 13/690,470

(22) Filed: Nov. 30, 2012

(65) Prior Publication Data
US 2014/0048795 A1 Feb. 20, 2014

(30) Foreign Application Priority Data
Aug. 14, 2012 (KR) .......................... 10-2012-0089140

(51) Int. Cl.
*H01L 29/24* (2006.01)
*H01L 29/49* (2006.01)
*H01L 29/786* (2006.01)

(52) U.S. Cl.
CPC ............ *H01L 29/24* (2013.01); *H01L 29/4908* (2013.01); *H01L 29/7869* (2013.01)

(58) Field of Classification Search
CPC ......... H01L 29/24; H01L 29/26; H01L 29/12; H01L 29/786; H01L 29/10; H01L 33/08
USPC .............. 257/43, 57, 290, 291, 292, 293, 443
See application file for complete search history.

(56) References Cited

U.S. PATENT DOCUMENTS

| 7,642,573 | B2 | 1/2010 | Hoffman et al. | |
|---|---|---|---|---|
| 2010/0289024 | A1* | 11/2010 | Ito | 257/59 |
| 2011/0312127 | A1* | 12/2011 | Ishizuka et al. | 438/104 |
| 2011/0317500 | A1* | 12/2011 | Uochi et al. | 257/43 |
| 2012/0001170 | A1* | 1/2012 | Yamazaki | 257/43 |
| 2012/0252160 | A1* | 10/2012 | Yamazaki | 438/104 |
| 2012/0305915 | A1* | 12/2012 | Abe et al. | 257/43 |

FOREIGN PATENT DOCUMENTS

| KR | 10-2008-0030454 A | 4/2008 |
|---|---|---|
| KR | 10-2011-0119880 A | 11/2011 |
| WO | 2010-044332 A1 | 4/2010 |

* cited by examiner

*Primary Examiner* — Chuong A Luu
(74) *Attorney, Agent, or Firm* — Robert E. Bushnell, Esq.

(57) ABSTRACT

Disclosed is a thin film transistor that includes a gate electrode, a semiconductor overlapping with the gate electrode, a source electrode that is electrically connected to the semiconductor, a drain electrode that is electrically connected to the semiconductor and faces the source electrode, and a stacked gate insulating layer that is positioned between the gate electrode and semiconductor. The stacked gate insulating layer includes an aluminum oxide layer. A method of manufacturing the same and a display device including the thin film transistor are also disclosed.

16 Claims, 9 Drawing Sheets

THIN FILM TRANSISTOR AND METHOD OF MANUFACTURING THE SAME AND DISPLAY DEVICE INCLUDING THE SAME

CROSS-REFERENCE TO RELATED APPLICATION

This application claims priority to and the benefit of Korean Patent Application No. 10-2012-0089140 filed in the Korean Intellectual Property Office on Aug. 14, 2012, the entire contents of which are incorporated herein by reference.

BACKGROUND

1. Field of the Invention

A thin film transistor and a method of manufacturing the same, and a display device including the thin film transistor are disclosed.

2. Description of the Related Art

An electron device such as a resistance, a capacitor, a diode, a thin film transistor, and the like is applied in various fields. In particular, the thin film transistor (TFT) is used as a switching device and a driving device in a display device such as a liquid crystal display (LCD), an organic light emitting diode (OLED) display, an electrophoretic display, and the like.

A semiconductor and a gate insulating layer in the thin film transistor are important components to determine device characteristics. The gate insulating layer is mainly made of an inorganic material such as silicon oxide. However, the silicon oxide has a high current leakage and thus, limitedly fabricates a device having high performance as well as is not appropriate for a semiconductor made of other materials than silicon. Accordingly, in order to fabricate a device having high performance, the gate insulating layer may be densely formed in an atomic layer deposition (ALD) process, which takes too long time and thus, may not be practically applied.

SUMMARY

One embodiment provides a thin film transistor being capable of improving performance and simplifying a process.

Another embodiment provides a method of manufacturing the thin film transistor.

Yet another embodiment provides a display device including the thin film transistor.

According to one embodiment, provided is a thin film transistor that includes a gate electrode, a semiconductor overlapping with the gate electrode, a source electrode that is electrically connected to the semiconductor, a drain electrode that is electrically connected to the semiconductor and faces the source electrode, and a stacked gate insulating layer that is positioned between the gate electrode and semiconductor. The stacked gate insulating layer includes an aluminum oxide layer.

The stacked gate insulating layer may further include a metal oxide layer positioned on a lower or upper side of the aluminum oxide layer.

The metal oxide layer may include at least one selected from the group consisting of hafnium (Hf), magnesium (Mg), calcium (Ca), zirconium (Zr), silicon (Si), yttrium (Y), strontium (Sr), tantalum (Ta), barium (Ba), and titanium (Ti).

The metal oxide may include $HfO_x$, $YO_x$, $ZrO_x$, TiOx, MgO, CaO, SrO, BaO, $Ta_2O_5$, $ZrSiO_4$, HfSiO ($0<x\leq2$), or a combination thereof.

The metal oxide layer may have a thickness of about 10 nm to about 300 nm, and the aluminum oxide layer may have a thickness of about 10 nm to about 200 nm.

The aluminum oxide layer may be in contact with the semiconductor.

The semiconductor may include an oxide semiconductor.

The oxide semiconductor may include an oxide including at least one selected from the group consisting of zinc (Zn), indium (In), and tin (Sn).

According to another embodiment, a method of manufacturing a thin film transistor that includes forming a gate electrode, forming a semiconductor overlapped with the gate electrode, forming a source electrode and a drain electrode that are electrically connected to the semiconductor, and forming a stacked gate insulating layer including an aluminum oxide layer between the gate electrode and the semiconductor.

The forming the stacked gate insulating layer may be performed by a solution process.

The forming the stacked gate insulating layer may include forming a metal oxide layer and forming an aluminum oxide layer.

The metal oxide layer may include a metal oxide including at least one selected from the group consisting of hafnium (Hf), magnesium (Mg), calcium (Ca), zirconium (Zr), silicon (Si), yttrium (Y), strontium (Sr), tantalum (Ta), barium (Ba), and titanium (Ti).

The forming the aluminum oxide layer may be performed by using an aluminum precursor solution including at least one selected from the group consisting of aluminum hydroxide, aluminum alkoxide, aluminum citrate, aluminum acetate, aluminum carbonate, aluminum (meth)acrylate, aluminum nitrate, aluminum acetylacetonate, aluminum halide, aluminum thiocarbamate, aluminum sulfonate, aluminum undecylate, aluminum borate, and hydrates thereof, and the forming the metal oxide layer may be performed by using a metal precursor solution including at least one selected from the group consisting of metal hydroxide, metal alkoxide, metal citrate, metal acetate, metal carbonate, metal (meth)acrylate, metal nitrate, metal acetylacetonate, metal halide, metal thiocarbamate, metal sulfonate, metal undecylate, metal borate, and hydrates thereof, wherein the metal may include at least one selected from the group consisting of hafnium (Hf), magnesium (Mg), calcium (Ca), zirconium (Zr), silicon (Si), yttrium (Y), strontium (Sr), tantalum (Ta), barium (Ba), and titanium (Ti).

The forming the stacked gate insulating layer may include annealing at about 100° C. to about 400° C.

The forming the semiconductor may be performed by a solution process.

The forming the semiconductor may include applying a precursor solution including at least one selected from the group consisting of zinc (Zn), indium (In), and tin (Sn) and heat-treating the precursor solution to form an oxide semiconductor.

According to yet another embodiment, a display device including the thin film transistor is provided.

DETAILED DESCRIPTION

Figure 1:
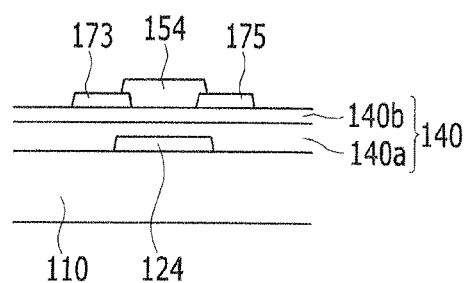
FIG. 1 is a cross-sectional view showing a thin film transistor according to one embodiment.

This disclosure will be more fully described hereinafter with reference to the accompanying drawings, in which exemplary embodiments of this disclosure are shown. As those skilled in the art would realize, the described embodiments may be modified in various different ways, all without departing from the spirit or scope of this disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, referring to FIG. 1, a thin film transistor according to one embodiment is described.

FIG. 1 is a cross-sectional view showing a thin film transistor according to one embodiment.

Referring to FIG. 1, the thin film transistor according to one embodiment includes a gate electrode 124 formed on a substrate 110, a stacked gate insulating layer 140 formed on the gate electrode 124, a source electrode 173 and a drain electrode 175 formed on the stacked gate insulating layer 140, a semiconductor 154 electrically connected to the source electrode 173 and the drain electrode 175, respectively.

The substrate 110 may be glass substrate, a polymer substrate, or silicon wafer.

The gate electrode 124 is connected to a gate line (not shown) extending along one direction of the substrate 110.

The semiconductor 154 (or semiconductor layer) overlaps with the gate electrode 124. The semiconductor 154 may be an oxide semiconductor. The oxide semiconductor may include, for example, at least one selected from zinc (Zn), indium (In) or tin (Sn), and may be, for example, zinc oxide (ZnO), indium zinc oxide (IZO), indium tin oxide (ITO), zinc tin oxide (ZTO), or a combination thereof.

The source electrode 173 is connected to a data line (not shown) extending along one direction of the substrate 110 and may be electrically connected to the semiconductor 154 when a voltage is applied thereto. The drain electrode 175 faces the source electrode 173 with the semiconductor 154 disposed between the source electrode 173 and the drain electrode 175, and may be electrically connected to the semiconductor 154 when a voltage is applied thereto.

The stacked gate insulating layer 140 may be positioned between the gate electrode 124 and the semiconductor 154 and cover the entire surface of the substrate 110. The stacked gate insulating layer 140 may include an aluminum oxide layer and be formed by stacking two or more layers.

Referring to FIG. 1, the stacked gate insulating layer 140 may include a metal oxide layer 140a and an aluminum oxide layer 140b.

The metal oxide layer 140a may be formed of a metal oxide including a metal except for aluminum. The metal oxide may have relatively high dielectric constant ranging from about 4 to about 100. The metal oxide may be an metal oxide including, for example, at least one selected from hafnium (Hf), magnesium (Mg), calcium (Ca), zirconium (Zr), silicon (Si), yttrium (Y), strontium (Sr), tantalum (Ta), barium (Ba), or titanium (Ti), for example, $HfO_x$, $YO_x$, $ZrO_x$, TiOx, MgO, CaO, SrO, BaO, $Ta_2O_5$, $ZrSiO_4$, HfSiO (0<x≤2), or a combination thereof.

The metal oxide layer 140a includes a metal oxide having a high dielectric constant and thus, may make a device operated at a low voltage and increase performance as a gate insulating layer. The metal oxide layer 140a may be about 10 nm to about 300 nm thick. Specifically, the metal oxide layer 140a may have a thickness ranging from about 10 nm to about 90 nm within the range and more specifically, about 30 nm to about 70 nm.

The aluminum oxide layer 140b may be in contact with the semiconductor 154. FIG. 1 shows that the metal oxide layer 140a is positioned under the aluminum oxide layer 140b, and the semiconductor 154 contacts the aluminum oxide layer 140b, but the present invention is not limited thereto. The metal oxide layer 140a may be positioned on the aluminum oxide layer 140b, and the semiconductor 154 may contact the metal oxide layer 140a.

The aluminum oxide layer 140b has a high dielectric constant and thus, high charge mobility, low threshold voltage, and high stability. The aluminum oxide layer 140b may be about 10 nm to about 200 nm thick. The aluminum oxide layer 140b having a thickness within the range may have low surface roughness and thus, have excellent contact characteristics with a semiconductor and decrease a current leakage. The aluminum oxide layer 140b may have a thickness ranging from about 10 nm to about 60 nm within the range and specifically, about 20 nm to about 50 nm.

FIG. 1 shows a thin film transistor having a bottom gate structure as one example, but the present invention is not limited thereto and may include any structure of a thin film transistor, for example, a top gate structure.

Figure 6:
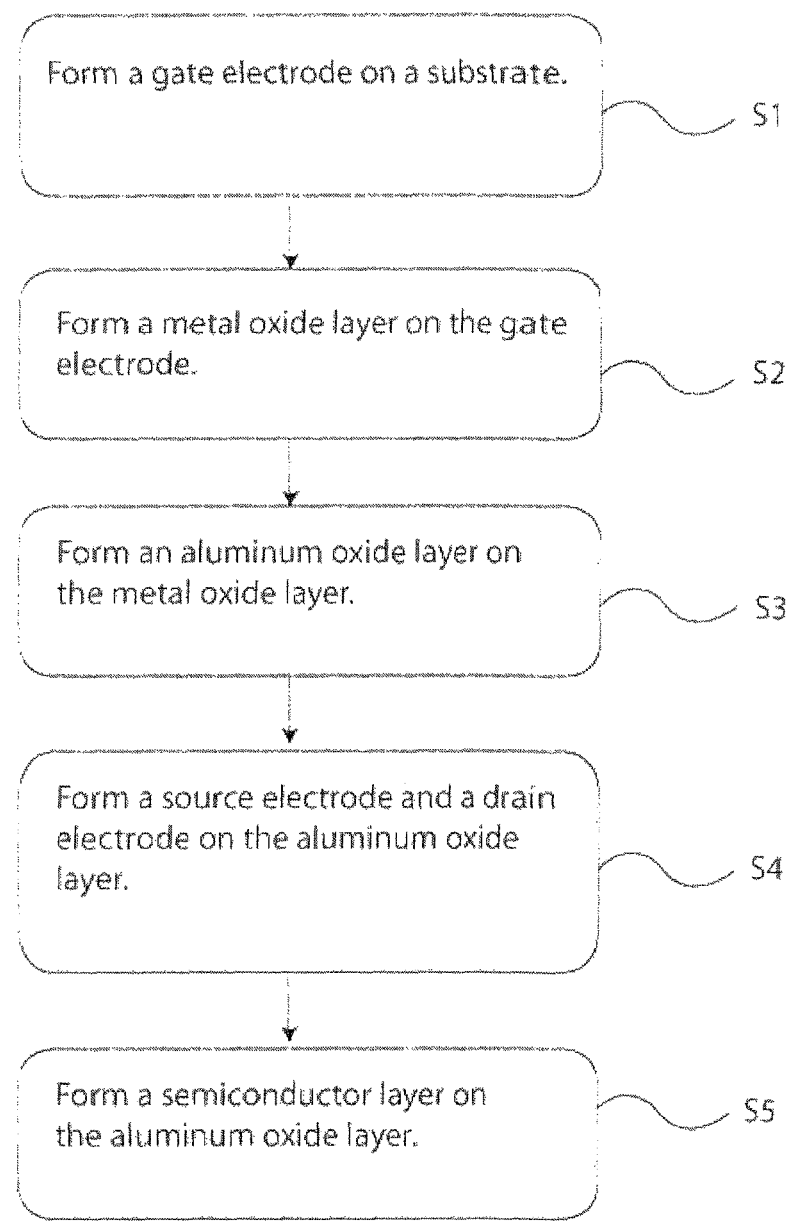
FIG. 6 is a flow chart showing the steps of a method of manufacturing a thin film transistor.

Hereinafter, a method of manufacturing the aforementioned thin film transistor is described referring to FIG. 1 and FIG. 6.

According to one embodiment, a method of manufacturing a thin film transistor includes forming a gate electrode 124 on a substrate 110 (S1), forming a metal oxide layer 140a on the gate electrode 124 (S2), forming an aluminum oxide layer 140b on the metal oxide layer (S3), forming a source electrode 173 and a drain electrode 175 on the aluminum oxide layer 140b (S4), and forming a semiconductor 154 overlapping with the gate electrode 124 on the aluminum oxide layer 140b (S5). The source electrode 173 and a drain electrode 175 are electrically connected to the semiconductor 154. Forming a stacked gate insulating layer 140 between the gate electrode 124 and the semiconductor 154 may include the forming a metal oxide layer 140a on the gate electrode 124 (S2), and the forming an aluminum oxide layer 140b on the metal oxide layer (S3).

The forming a gate electrode 124 and the forming a source electrode 173 and a drain electrode 175 may be performed by respectively stacking a conductor and performing photolithography.

The stacked gate insulating layer 140 and the semiconductor 154 may be respectively formed through a solution process using a precursor solution. Herein, the solution process includes processes of applying a precursor solution including a precursor and a solvent, and then annealing the applied precursor solution.

The forming the stacked gate insulating layer 140 may include forming a metal oxide layer 140a and forming an aluminum oxide layer 140b.

The forming the metal oxide layer 140a may be performed, for example, by applying a metal precursor solution including a metal precursor and a solvent and then annealing the applied metal precursor solution. The metal precursor may be at least one selected from, for example, metal hydroxide, metal alkoxide, metal citrate, metal acetate, metal carbonate, metal (meth)acrylate, metal nitrate, metal acetylacetonate, metal halide, metal thiocarbamate, metal sulfonate, metal undecylate, metal borate, or hydrates thereof, wherein the metal may include, for example at least one selected from hafnium (Hf), magnesium (Mg), calcium (Ca), zirconium (Zr), silicon (Si), yttrium (Y), strontium (Sr), tantalum (Ta), barium (Ba), or titanium (Ti).

The forming the aluminum oxide layer 140b may be performed, for example, by applying an aluminum precursor solution including an aluminum precursor and a solvent and then, annealing the applied aluminum precursor solution. The aluminum precursor may be at least one selected from, for example, aluminum hydroxide, aluminum alkoxide, aluminum citrate, aluminum acetate, aluminum carbonate, aluminum (meth)acrylate, aluminum nitrate, aluminum acetylacetonate, aluminum halide, aluminum thiocarbamate, aluminum sulfonate, aluminum undecylate, aluminum borate, or hydrates thereof.

The solvent may be any one where components may dissolve therein without limitation, and may be at least one selected from, for example deionized water, methanol, ethanol, propanol, isopropanol, 2-methoxyethanol, 2-ethoxyethanol, 2-propoxyethanol 2-butoxyethanol, methylcellosolve, ethylcellosolve, ethyleneglycol, diethyleneglycolmethylether, diethyleneglycolethylether, dipropyleneglycolmethylether, toluene, xylene, hexane, heptane, octane, ethylacetate, butylacetate, diethyleneglycoldimethylether, diethyleneglycoldimethylethylether, methylmethoxypropionic acid, ethylethoxypropionic acid, ethyllactic acid, propyleneglycolmethyletheracetate, propyleneglycolmethylether, propylene glycolpropylether, methylcellosolveacetate, ethylcellosolveacetate, diethyleneglycolmethylacetate, diethyleneglycolethylacetate, acetone, methylisobutylketone, cyclohexanone, dimethyl formamide (DMF), N,N-dimethyl acetamide (DMAc), N-methyl-2-pyrrolidone, γ-butyrolactone, diethylether, ethyleneglycoldimethylether, diglyme, tetrahydrofuran, acetylacetone, or acetonitrile.

The applying the solution may be performed, for example, spin coating, slit coating, inkjet printing, spraying, dipping, or the like, but is not limited thereto.

The annealing may be performed, for example, at a temperature ranging from about 100° C. to about 400° C. By annealing, the metal precursor solution may be into a metal oxide layer and the aluminum precursor solution may be into an aluminum oxide layer. The annealing may be performed by pre-baking the precursor solutions at a relatively low temperature and transforming a solution in a sol state into a gel state.

Herein, the applying the solutions and annealing may be once or more repetitively performed to form the metal oxide layer 140a and the aluminum oxide layer 140b having a predetermined thickness.

Next, the forming the semiconductor 154 may be performed by a solution process using a precursor, for example, applying a precursor solution including a precursor including at least one selected from zinc (Zn), indium (In), or tin (Sn), and a solvent, and then annealing the applied precursor solution. The precursor may be, for example, a zinc-containing precursor, an indium-containing precursor, or a tin-containing precursor.

The zinc-containing precursor may include at least one selected from, for example, zinc hydroxide; zinc alkoxide; zinc citrate; zinc acetate such as zinc trifluoroacetate; zinc carbonylate; zinc carbonate; zinc (meth)acrylate; zinc nitrate; zinc acetylacetonate such as zinc hexafluoroacetylacetonate; zinc halide such as zinc fluoride, zinc chloride, zinc perchlorate, or the like; zinc thiocarbamate such as zinc dimethyl dithiocarbamate; zinc sulfonate such as zinc trifluoromethane sulfonate; zinc undecylate; zinc phosphate; zinc borate such as zinc tetrafluoroborate; or hydrates thereof, but is not limited thereto.

The indium-containing precursor may include at least one selected from, for example, indium hydroxide; indium alkoxide; indium citrate; indium acetate; indium carbonate; indium (meth)acrylate; indium nitrate; indium acetylacetonate; indium halide such as indium chloride, indium fluoride, or the like; indium thiocarbamate; indium sulfonate; indium undecylate; indium borate; or hydrates thereof, but is not limited thereto.

The tin-containing precursor may include at least one selected from, for example, tin hydroxide; tin alkoxide; tin citrate; tin acetate; tin carbonate; tin (meth)acrylate; tin nitrate; tin acetylacetonate; tin halide such as tin chloride, tin fluoride, and the like; tin thiocarbamate; tin sulfonate; tin undecylate; tin borate; or hydrates thereof, but is not limited thereto.

The applying the precursor solution may be performed, for example, spin coating, slit coating, inkjet printing, spraying, dipping, or the like but is not limited thereto.

The annealing may be performed, for example, at a temperature ranging from about 100° C. to about 600° C. By annealing, the precursor solution may be into an oxide semiconductor.

Hereinafter, a display device including the aforementioned thin film transistor is illustrated.

The display device may be applied to an active matrix device including a thin film transistor, for example, a liquid crystal display (LCD), an organic light emitting diode (OLED) device, an electrophoresis device, and the like without a particular limit.

Herein, an organic light emitting diode (OLED) device as one example display device is illustrated.

Figure 2:
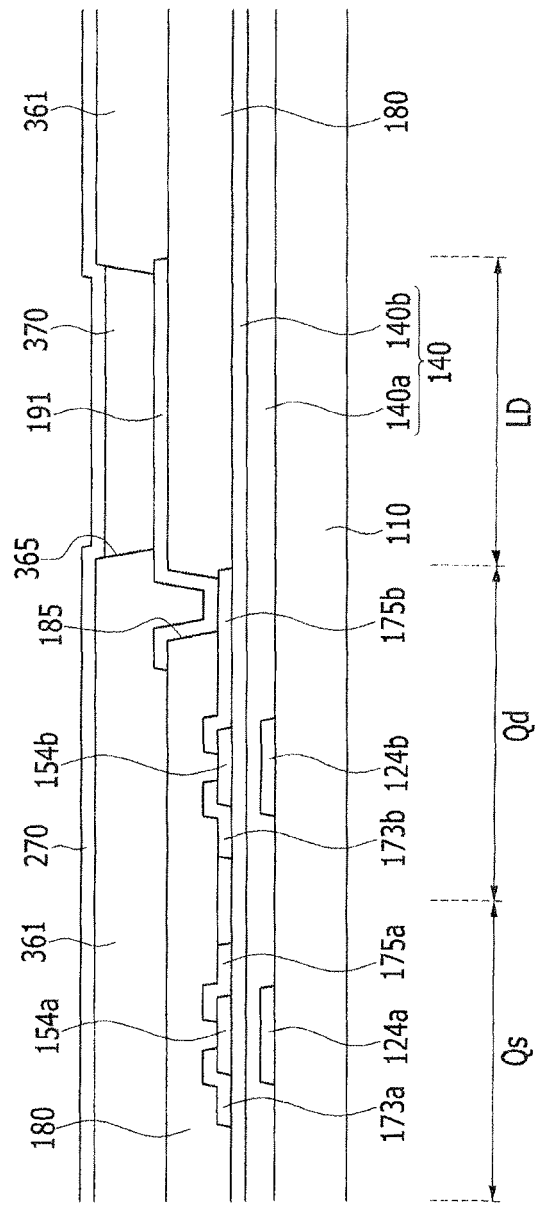
FIG. 2 is a cross-sectional view showing an organic light emitting device according to one embodiment.

FIG. 2 is a cross-sectional view of an organic light emitting device according to one embodiment.

According to one embodiment, an organic light emitting diode device includes a switching transistor region (Qs) including a switching thin film transistor, a driving transistor region (Qd) including a driving thin film transistor, and a light emitting region (LD) including an organic light emitting diode (OLED) in each pixel.

The switching thin film transistor has a control terminal, an input terminal, and an output terminal. The control terminal is connected to a gate line (not shown), the input terminal is connected to a data line (not shown), and the output terminal is connected to the driving thin film transistor. The switching thin film transistor responds to scanning signals applied to the gate line and transmits data signals applied to the data line into the driving thin film transistor.

The driving thin film transistor also has a control terminal, an input terminal, and an output terminal. The control terminal is connected to the switching thin film transistor, the input terminal is connected to a driving voltage line (not shown), and the output terminal is connected to the organic light emitting diode (OLED). The driving thin film transistor transmits an output current depending on a voltage applied between control and output terminals.

The organic light emitting diode (OLED) has an anode connected to the output terminal of the driving thin film transistor and a cathode connected to a common voltage. The organic light emitting diode (OLED) emits a light with a different strength varied depending on output current of the driving thin film transistor and thus, displays an image.

Referring to FIG. 2, a switching control electrode 124a and a driving control electrode 124b are formed on a substrate 110 made of glass, a polymer film, a silicon wafer, or the like.

The switching control electrode 124a is connected to a gate line (not shown) and receives gate signal from the gate line.

The driving control electrode 124b is an island type.

On the switching control electrode 124a and the driving control electrode 124b, a stacked gate insulating layer 140 is formed. The stacked gate insulating layer 140 includes a metal oxide layer 140a and an aluminum oxide layer 140b, as aforementioned.

On the stacked gate insulating layer 140, a switching semiconductor 154a and a driving semiconductor 154b are formed. The switching semiconductor 154a overlaps with the switching control electrode 124a, and the driving semiconductor 154b is overlapped with the driving control electrode 124b. The switching semiconductor 154a and the driving semiconductor 154b respectively have island types and may be oxide semiconductors as aforementioned.

On the switching semiconductor 154a, a switching input electrode 173a and a switching output electrode 175a electrically connected to the switching semiconductor 154a are formed.

The switching input electrode 173a is connected to a data line (not shown) and receives data signals from the data line. The switching output electrode 175a is connected to a driving control electrode 124b.

On the driving semiconductor 154b, a driving input electrode 173b and a driving output electrode 175b electrically connected to the driving semiconductor 154b are formed. The driving input electrode 173b is connected to a driving voltage line (not shown). The driving output electrode 175b is connected to a pixel electrode 191 illustrated later.

On the switching input electrode 173a, the switching output electrode 175a, the driving input electrode 173b, and the driving output electrode 175b, a protective layer 180 is formed.

The protective layer 180 has a contact hole 185 exposing the driving output electrode 175b.

On the protective layer 180, a pixel electrode 191 is formed. The pixel electrode 191 is connected to the output electrode 175b through the contact hole 185.

The pixel electrode 191 may be formed of a conductive oxide, for example, indium tin oxide (ITO), indium zinc oxide (IZO), aluminum-doped zinc oxide (AZO), indium gallium zinc oxide (IGZO), or a combination thereof.

On the pixel electrode 191, a pixel definition layer 361 is formed. The pixel definition layer 361 has an opening 365 exposing the pixel electrode 191, and a light emitting region (LD) is defined by the pixel definition layer 361 surrounding the opening 365. The pixel definition layer 361 may be made of, for example, a photosensitive organic material.

In addition, an organic light emitting member 370 is formed in the light emitting region (LD) surrounded by the pixel definition layer 361.

The organic light emitting member 370 includes an emission layer and an auxiliary layer.

The emission layer may be made of organic materials inherently displaying a color such as red, green, and blue, and the like and also, display a white light by combining these colors.

The auxiliary layer may be formed on and/or under the emission layer and may be a hole injection layer (HIL), a hole transport layer (HTL), an electron injection layer (EIL), and/or an electron transport layer (ETL).

On the pixel definition layer 361 and the organic light emitting member 370, a common electrode 270 is formed. The common electrode 270 may be made of a transparent conductor or a metal having a high reflection rate.

In the aforementioned organic light emitting device, either one of the pixel electrode 191 and the common electrode 270 is an anode, while the other is a cathode. The anode and cathode as a pair supply electrical current to the organic light emitting member 370.

The following examples illustrate this disclosure in more detail. However, the following are exemplary embodiments and are not limiting.

PREPARATION OF PRECURSOR SOLUTION

Preparation Example 1

Hafnium chloride was added in a mixed solvent of acetonitrile and ethylene glycol (35:65(v/v)) to be 0.2 M of a concentration and then, fervently agitating the mixture under a nitrogen atmosphere to prepare a hafnium precursor solution.

Preparation Example 2

Aluminum chloride was added in a mixed solvent of acetonitrile and ethylene glycol (35:65 (v/v)) to be 0.2 M of a concentration and then fervently agitating the mixture under a nitrogen atmosphere to prepare an aluminum precursor solution.

Preparation Example 3

Zinc chloride and tin chloride were added in a mixed solvent of acetonitrile and ethylene glycol (35:65 (v/v)) to be 0.6 M of a concentration and then fervently agitating the mixture under a nitrogen atmosphere to prepare a zinc tin precursor solution.

Fabrication of Thin Film Transistor

EXAMPLE

Molybdenum (Mo) was deposited on a glass substrate and patterned by a photolithography to form a gate electrode. Next, the hafnium precursor solution according to Preparation Example 1 was spin-coated thereon and annealed at 250° C. to form a about 70 nm thick hafnium oxide layer. Then, the aluminum precursor solution according to Preparation Example 2 was spin-coated on the hafnium oxide layer and annealed at 250° C. to form about 25 nm thick aluminum oxide layer. Then, an IZO was deposited thereon and patterned by a photolithography to form a source electrode and a drain electrode. On the aluminum oxide layer, the source electrode and the drain electrode, the zinc tin precursor solution according to Preparation Example 3 was spin-coated and annealed at 250° C. to form a zinc tin oxide (ZTO) semiconductor. The resulting product was annealed at 400° C. to form a thin film transistor.

Comparative Example 1

A thin film transistor was fabricated according to the same method as Example except for forming no hafnium oxide layer.

Comparative Example 2

A thin film transistor was fabricated according to the same method as Example except for forming no aluminum oxide layer.

Evaluation

The thin film transistors according to Example and Comparative Examples 1 and 2 were evaluated regarding current-voltage characteristic.

Figure 3A:
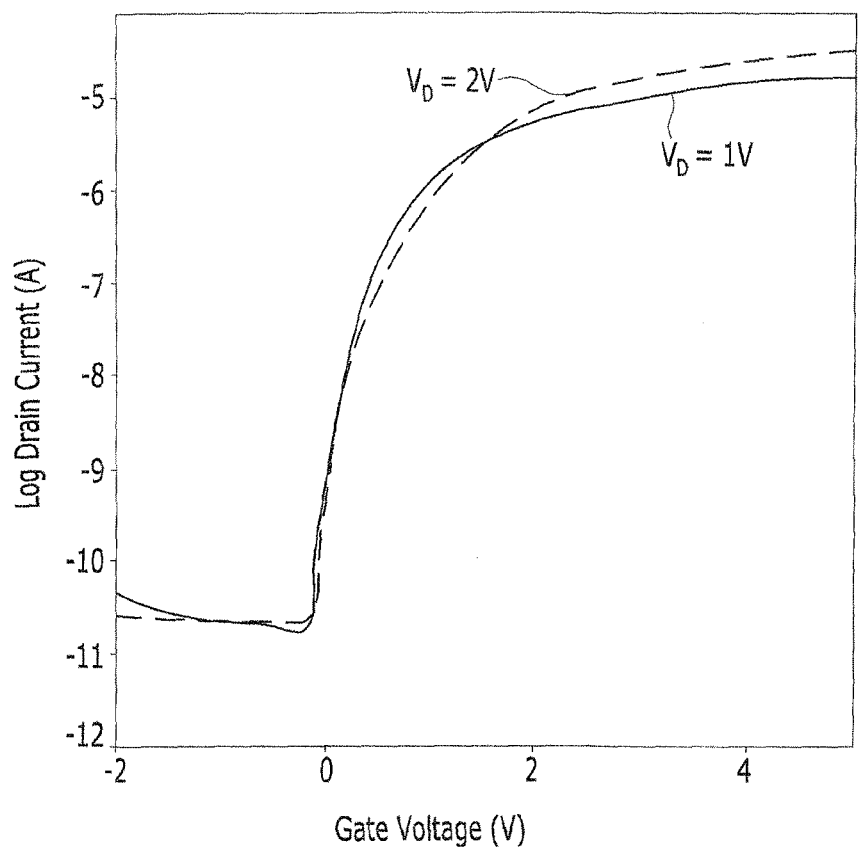
FIG. 3A is a current-voltage graph showing transport properties of the thin film transistor according to Example.
Figure 3B:
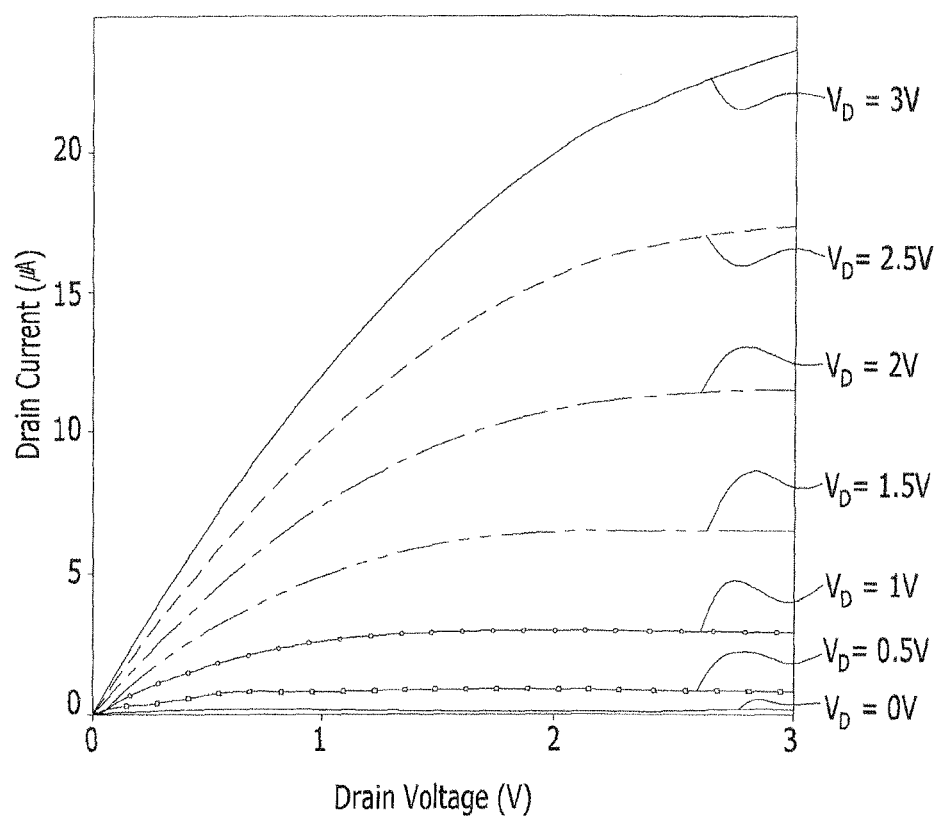
FIG. 3B is a current-voltage graph showing output characteristics of the thin film transistor according to Example.
Figure 4A:
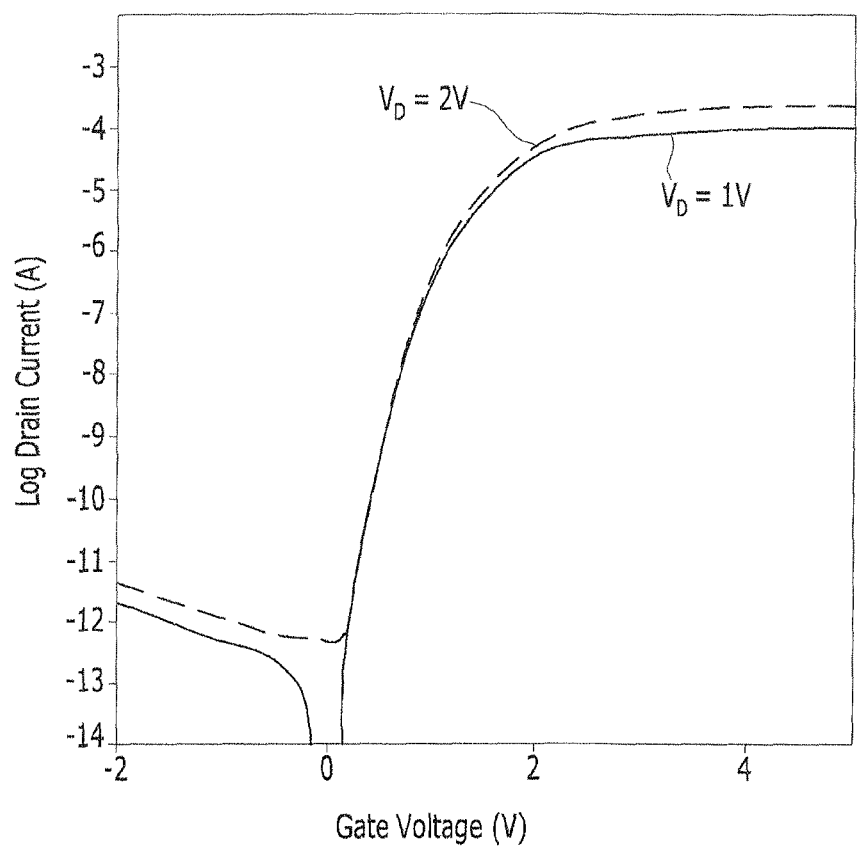
FIG. 4A is a current-voltage graph showing transport properties of the thin film transistor according to Comparative Example 1.
Figure 4B:
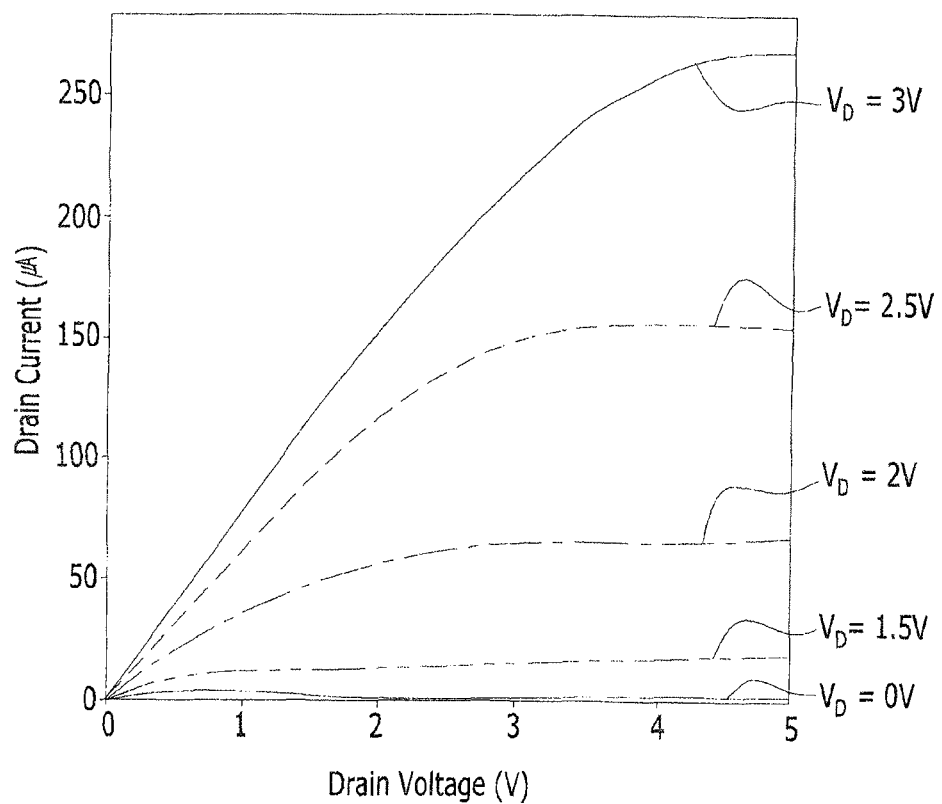
FIG. 4B is a current-voltage graph showing output characteristics of the thin film transistor according to Comparative Example 1.
Figure 5A:
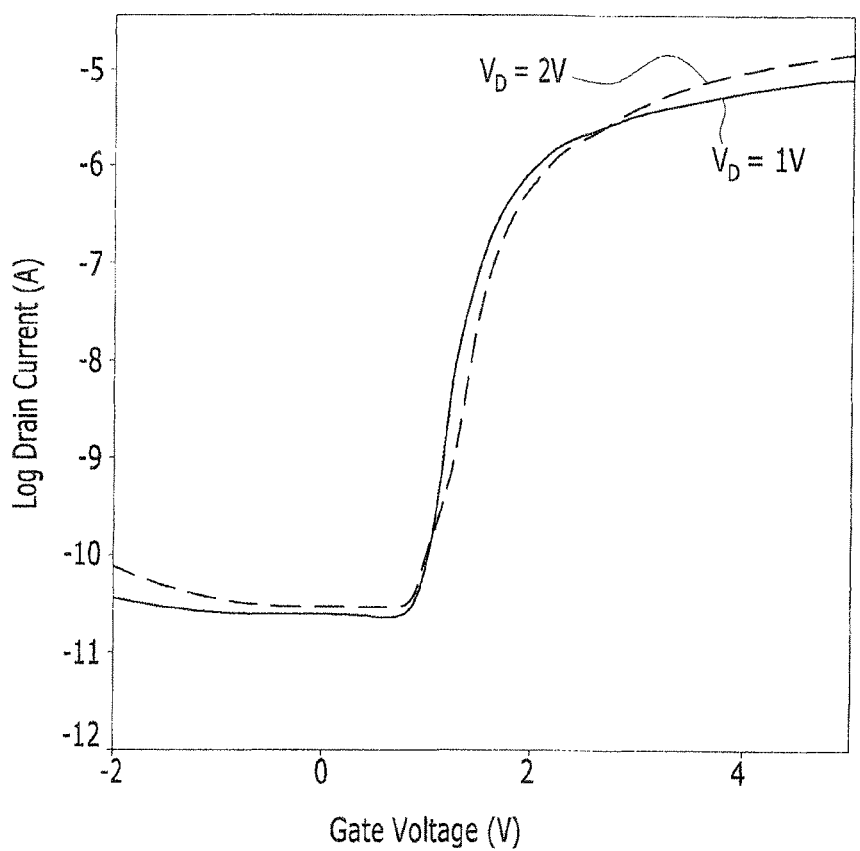
FIG. 5A is a current-voltage graph showing transport properties of the thin film transistor according to Comparative Example 2.
Figure 5B:
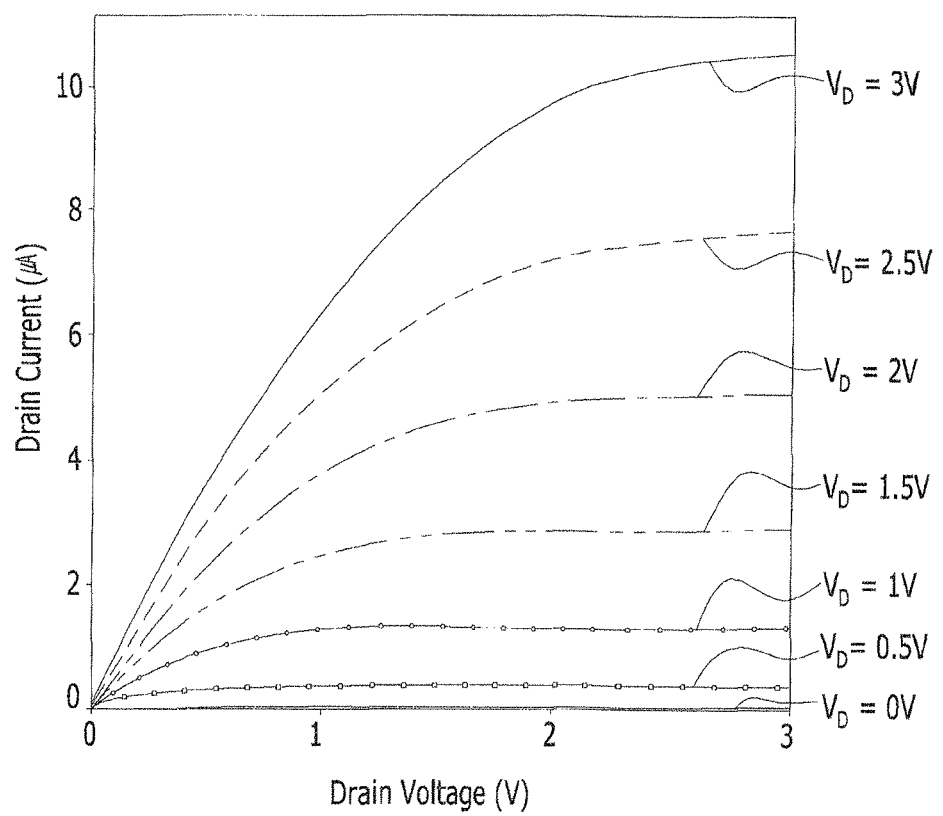
FIG. 5B is a current-voltage graph showing output characteristics of the thin film transistor according to Comparative Example 2.

FIG. 3A is a current-voltage graph showing transport properties of the thin film transistor according to Example, FIG. 3B is a current-voltage graph showing output characteristics of the thin film transistor according to Example, FIG. 4A is a current-voltage graph showing transport properties of the thin film transistor according to Comparative Example 1, FIG. 4B is a current-voltage graph showing output characteristics of the thin film transistor according to Comparative Example 1, FIG. 5A is a current-voltage graph showing transport properties of the thin film transistor according to Comparative Example 2, and FIG. 5B is a current-voltage graph showing output characteristics of the thin film transistor according to Comparative Example 2.

Referring to FIGS. 3A and 3B, the thin film transistor according to Example turned out to have high gate bias stability and no hysteresis characteristic as well as excellent charge mobility and low subthreshold swing.

On the contrary, referring to FIGS. 4A and 4B, the thin film transistor according to Comparative Example 1 had good charge mobility and low subthreshold swing but hysteresis characteristic of greater than or equal to 2V.

Referring to FIGS. 5A and 5B, the thin film transistor according to Comparative Example 2 had high gate bias stability and no hysteresis characteristic but low charge mobility and high subthreshold swing.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor, comprising:
a gate electrode,
a semiconductor overlapping with the gate electrode,
a source electrode electrically connected to the semiconductor,
a drain electrode electrically connected to the semiconductor and facing the source electrode, and
a stacked gate insulating layer positioned between the gate electrode and the semiconductor, the stacked gate insulating layer comprising an aluminum oxide layer and a metal oxide layer disposed between the gate electrode and the aluminum oxide layer, the aluminum oxide layer consisting of aluminum oxide, the metal oxide layer consisting of one selected from the group consisting of hafnium (Hf), magnesium (Mg), calcium (Ca), zirconium (Zr), yttrium (Y), strontium (Sr), tantalum (Ta), barium (Ba), and titanium (Ti), wherein the metal oxide layer has a thickness of about 10 nm to about 300 nm, and the aluminum oxide layer has a thickness of about 10 nm to about 200 nm, and the aluminum oxide layer is in direct contact with the semiconductor, and the metal oxide layer is in direct contact with the gate electrode, and the aluminum oxide layer is disposed on the metal oxide layer.

2. The thin film transistor of claim 1, wherein the metal oxide layer further comprises silicon (Si).

3. The thin film transistor of claim 1, wherein the metal oxide layer comprises one selected from the group consisting of $HfO_x$, $YO_x$, $ZrO_x$, $TiO_x$, $MgO$, $CaO$, $SrO$, $BaO$, $Ta_2O_5$, $ZrSiO_4$, $HfSiO$ ($0<x\leq 2$), and a combination thereof.

4. The thin film transistor of claim 1, wherein the semiconductor comprises an oxide semiconductor.

5. The thin film transistor of claim 4, wherein the oxide semiconductor comprises an oxide including at least one selected from the group consisting of zinc (Zn), indium (In), and tin (Sn).

6. A method of manufacturing a thin film transistor, comprising:
forming a gate electrode,
forming a semiconductor overlapping with the gate electrode,
forming a source electrode and a drain electrode that are electrically connected to the semiconductor, and
forming a stacked gate insulating layer disposed between the gate electrode and the semiconductor, the stacked gate insulating layer comprising an aluminum oxide layer and a metal oxide layer disposed between the gate electrode and the aluminum oxide layer, the aluminum oxide layer consisting of aluminum oxide, the metal oxide layer consisting of one selected from the group consisting of hafnium (Hf), magnesium (Mg), calcium (Ca), zirconium (Zr), yttrium (Y), strontium (Sr), tantalum (Ta), barium (Ba), and titanium (Ti), wherein the metal oxide layer has a thickness of about 10 nm to about 300 nm, and the aluminum oxide layer has a thickness of about 10 nm to about 200 nm, and the aluminum oxide layer is in direct contact with the semiconductor, and the metal oxide layer is in direct contact with the gate electrode, and the aluminum oxide layer is disposed on the metal oxide layer.

7. The method of claim 6, wherein the forming the stacked gate insulating layer is performed by a solution process.

8. The method of claim 6, wherein the forming the stacked gate insulating layer comprises:
forming the metal oxide layer, and
forming the aluminum oxide layer.

9. The method of claim 8, wherein the metal oxide layer further comprises silicon (Si).

10. The method of claim 8, wherein:
the forming the aluminum oxide layer is performed by using an aluminum precursor solution including at least one selected from the group consisting of aluminum hydroxide, aluminum alkoxide, aluminum citrate, aluminum acetate, aluminum carbonate, aluminum (meth)acrylate, aluminum nitrate, aluminum acetylacetonate, aluminum halide, aluminum thiocarbamate, aluminum sulfonate, aluminum undecylate, aluminum borate, and hydrates thereof; and the forming the metal oxide layer is performed by using a metal precursor solution including at least one selected from the group consisting of metal hydroxide, metal alkoxide, metal citrate, metal acetate, metal carbonate, metal (meth)acrylate, metal nitrate, metal acetylacetonate, metal halide, metal thiocarbamate, metal sulfonate, metal undecylate, metal borate, and hydrates thereof, wherein the metal comprises at least one selected from the group consisting of hafnium (Hf), magnesium (Mg), calcium (Ca), zirconium (Zr), silicon (Si), yttrium (Y), strontium (Sr), tantalum (Ta), barium (Ba), and titanium (Ti).

11. The method of claim 6, wherein the forming the stacked gate insulating layer comprises annealing at about 100° C. to about 400° C.

12. The method of claim 6, wherein the forming the semiconductor is performed by a solution process.

13. The method of claim 12, wherein the forming the semiconductor comprises:
applying a precursor solution including at least one selected from the group consisting of zinc (Zn), indium (In), and tin (Sn); and
heat-treating the precursor solution to form an oxide semiconductor.

14. A display device, comprising a thin film transistor that comprises:
a gate electrode,
a semiconductor overlapping with the gate electrode,
a source electrode electrically connected to the semiconductor,
a drain electrode electrically connected to the semiconductor and facing the source electrode, and
a stacked gate insulating layer positioned between the gate electrode and the semiconductor, the stacked gate insulating layer comprising an aluminum oxide layer and a metal oxide layer disposed between the gate electrode and the aluminum oxide layer, the aluminum oxide layer consisting of aluminum oxide, the metal oxide layer consisting of one selected from the group consisting of hafnium (Hf), magnesium (Mg), calcium (Ca), zirconium (Zr), yttrium (Y), strontium (Sr), tantalum (Ta), barium (Ba), and titanium (Ti), wherein the metal oxide layer has a thickness of about 10 nm to about 300 nm, and the aluminum oxide layer has a thickness of about 10 nm to about 200 nm, and the aluminum oxide layer is in direct contact with the semiconductor, and the metal oxide layer is in direct contact with the gate electrode, and the aluminum oxide layer is disposed on the metal oxide layer.

15. The thin film transistor of claim 14, wherein the semiconductor comprises an oxide semiconductor.

16. The thin film transistor of claim 15, wherein the oxide semiconductor comprises an oxide including at least one selected from the group consisting of zinc (Zn), indium (In), and tin (Sn).

* * * * *